(12) United States Patent
Uesaka

(10) Patent No.: US 9,686,018 B2
(45) Date of Patent: Jun. 20, 2017

(54) OPTICAL TRANSMITTER EMITTING LIGHT WITH NARROWED LINEWIDTH

(71) Applicant: SUMITOMO ELECTRIC INDUSTRIES, LTD., Osaka (JP)

(72) Inventor: Katsumi Uesaka, Yokohama (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 15/074,556

(22) Filed: Mar. 18, 2016

(65) Prior Publication Data

US 2016/0276803 A1 Sep. 22, 2016

Related U.S. Application Data

(60) Provisional application No. 62/136,267, filed on Mar. 20, 2015.

(51) Int. Cl.
| | |
|---|---|
| *H04B 10/572* | (2013.01) |
| *H01S 5/0625* | (2006.01) |
| *H01S 5/0683* | (2006.01) |
| *H01S 5/022* | (2006.01) |
| *H01S 5/068* | (2006.01) |
| *G02B 5/28* | (2006.01) |
| *H01S 5/12* | (2006.01) |
| *H01S 5/026* | (2006.01) |
| *H01S 5/06* | (2006.01) |
| *H01S 5/0687* | (2006.01) |

(52) U.S. Cl.
CPC .......... *H04B 10/572* (2013.01); *G02B 5/284* (2013.01); *H01S 5/02256* (2013.01); *H01S 5/0687* (2013.01); *H01S 5/06258* (2013.01); *H01S 5/06817* (2013.01); *H01S 5/06832* (2013.01); *H01S 5/0261* (2013.01); *H01S 5/0612* (2013.01); *H01S 5/1209* (2013.01)

(58) Field of Classification Search
None
See application file for complete search history.

(56) References Cited

U.S. PATENT DOCUMENTS

| 7,894,693 B2 | 2/2011 | Fujii | |
|---|---|---|---|
| 2013/0094528 A1* | 4/2013 | Ikagawa | H01S 3/10 372/20 |
| 2013/0235891 A1* | 9/2013 | Fukuda | H01S 3/13 372/20 |

OTHER PUBLICATIONS

M. Ohtsu, et al., "Linewidth Reduction of a Semiconductor Laser by Electrical Feedback", IEEE J. Quantum Electronics, vol. QE-21, No. 12, 1985, pp. 1905-1912.

(Continued)

*Primary Examiner* — David Payne
*Assistant Examiner* — Casey Kretzer
(74) *Attorney, Agent, or Firm* — Smith, Gambrell & Russell, LLP.

(57) ABSTRACT

An optical transmitter that narrows the linewidth of its output light is disclosed. The optical transmitter includes a wavelength tunable laser diode (LD) known as a CSG-DR LD integrated with a semiconductor optical amplifier (SOA) driven in a constant magnitude mode. The wavelength of the light output from the LD is determined by transmission through an etalon filter. The optical transmitter feeds the output of the etalon filter back to an injection current supplied to the LD to reduce phase noise inherently contained in the output light.

12 Claims, 9 Drawing Sheets

(56) References Cited

OTHER PUBLICATIONS

A. Sivananthan, et al., "Integrated Linewidth Reduction of a Tunable SG-DBR Laser", CLEO: 2013 Technical Digest, OSA. 2013. (CTu1L.2.pdf).

A. Sivananthan, et al., "Monolithic Linewidth Narrowing of a Tunable SG-DBR Laser", OFC/NFOEC Technical Digest, OSA, 2013. (OTh3I.3.pdf).

* cited by examiner

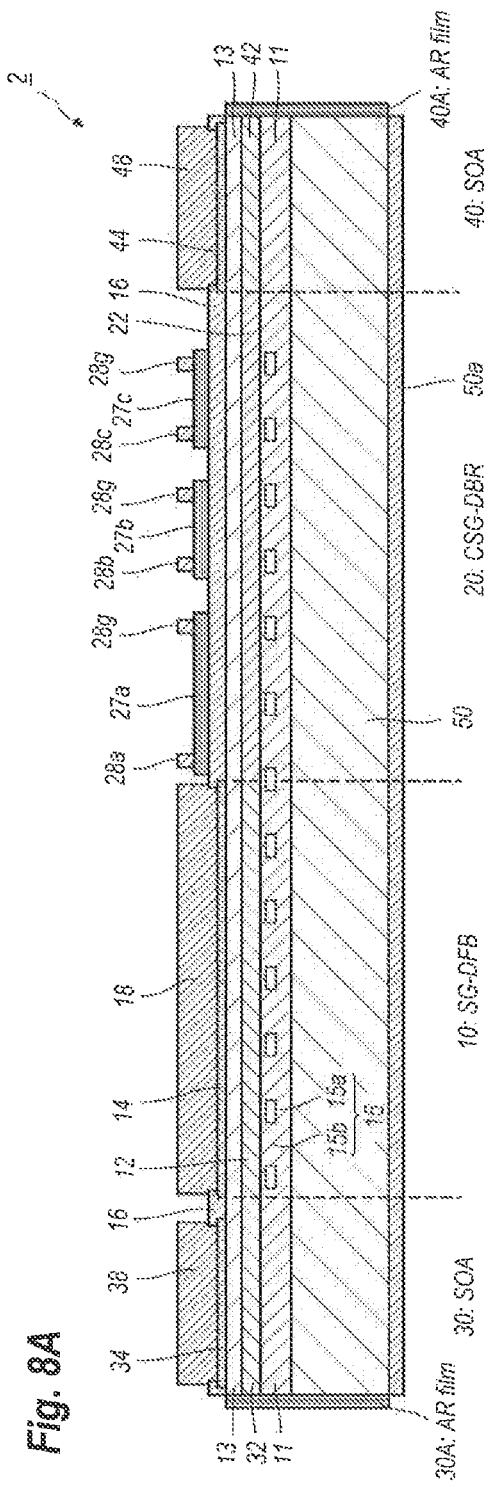
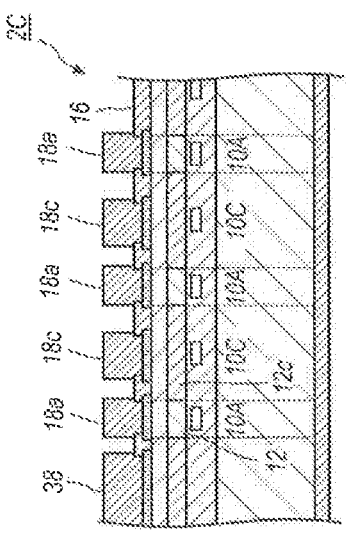
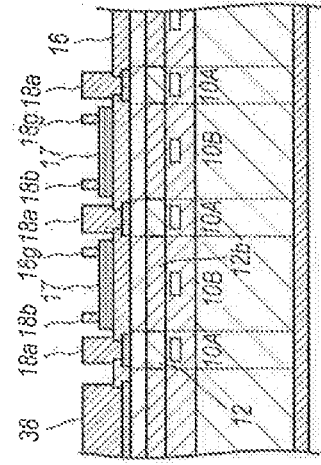
Fig. 8A
Fig. 8B
Fig. 8C

OPTICAL TRANSMITTER EMITTING LIGHT WITH NARROWED LINEWIDTH

CROSS REFERENCE TO RELATED APPLICATIONS

This application claims the priority under 35 U.S.C. §119 of U.S. Provisional Application Ser. No. 62/136,267, filed on Mar. 20, 2015, the contents of which is relied upon and incorporated herein by reference in its entirety.

BACKGROUND OF THE INVENTION

1. Field of the Invention

The present invention relates to an optical transmitter, in particular, the invention relates to an optical transmitter implementing a wavelength tunable laser diode (t-LD) capable of outputting light with a narrowed linewidth.

2. Background Arts

Various prior documents have reported to narrow the linewidth of the light emitted from an LD, where most of the prior techniques disclosed in the documents has fed the output light detected through an optical filter, whose transmittance shows wavelength dependence, back to a current injected into the LD. However, such a conventional technique is hard to be applied to an optical transmitter implemented within the optical coherent system.

The optical coherent system, in particular, the digital coherent system requests the optical transmitter to provide light with the spectral linewidth less than 300 kHz. Also, the digital coherent system inevitably requires the function for the optical source to tune the emission wavelength thereof. Accordingly, an LD implemented therein provides a structure including a gain section, a phase shifting section, and two Bragg reflector sections to tune the emission wavelength thereof. Each of those sections causes phase noises in the light output from the LD. The conventional technique to reduce the phase noise compensates only one of those sections. However, the compensation for the one section sometimes enhances the phase noises in the other sections, which degrades the RIN (relative intensity noise) in the output and inevitably sets the spectral linewidth of the light in an unsatisfactory performance.

SUMMARY OF THE INVENTION

An aspect of the present invention relates to an optical transmitter. The optical transmitter of the present application includes a wavelength tunable laser diode (t-LD), an optical component, and an optical detector. The t-LD, which emits light at a target wavelength, provides a sampled grating distributed feedback (SG-DFB) section and a chirped sampled grating distributed Bargg reflector (CSG-DBR) section. The combination of the SG-DB section and the CSG-DBR section forms an optical cavity that sets an emission wavelength of the t-LD at the target wavelength. The optical component, which has a wavelength dependent transmittance, receives the light emitted from the t-LD. The optical detector receives an output of the optical component. A feature of the optical transmitter of the present invention is that the output of the optical detector is superposed on a bias current supplied to the SG-DFB section of the t-LD.

BRIEF DESCRIPTION OF THE DRAWINGS

The foregoing and other purposes, aspects and advantages will be better understood from the following detailed description of a preferred embodiment of the invention with reference to the drawings, in which;

FIG. 8A shows a cross section of the CSG-DR LD implemented in the optical transmitter, FIG. 8B shows a cross section of another CSG-DR LD modified from that shown in FIG. 8A, and FIG. 8C shows a cross section of still another CSG-DR LD.

DESCRIPTION OF EMBODIMENT

Next, some examples of the present invention will be described as referring to drawings. In the description of the drawings, numerals or symbols same with or similar to each other will refer to elements same with or similar to each other without duplicating explanations.

First Embodiment

Figure 1:
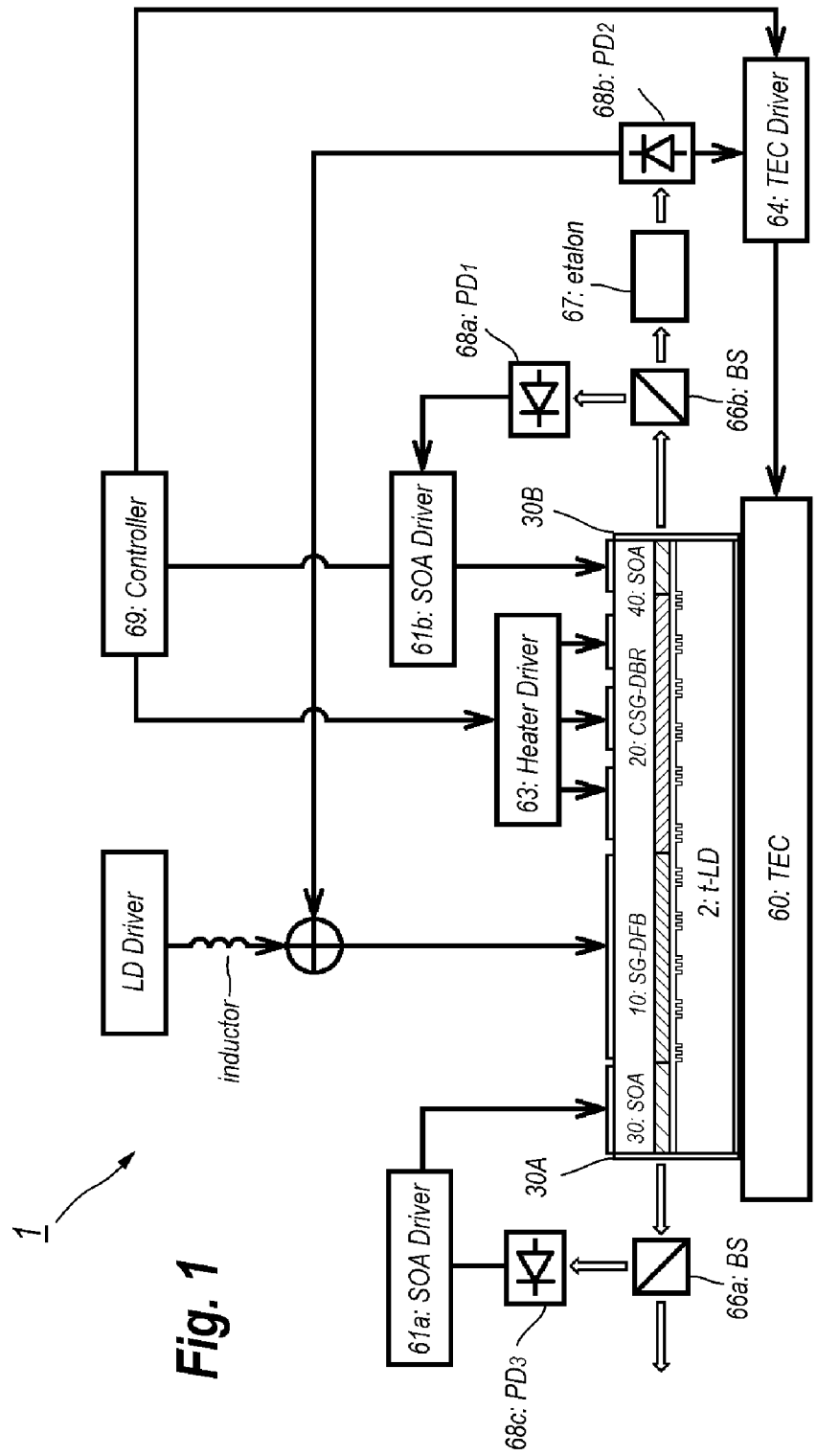
FIG. 1 shows a functional block diagram of an optical transmitter according to an embodiment of the present application.

FIG. 1 shows a functional block diagram of an optical transmitter according to an embodiment of the present application. The optical transmitter 1 of the present embodiment implements a wavelength tunable semiconductor laser diode (t-LD) type of, what is called, the chirped sampled grating distributed reflector (CSG-DR LD) that comprises a sampled grating distributed feedback (SG-DFB) section and a chirped sampled grating distributed Bragg reflector (CSG-DBR) section to tune an emission wavelength thereof. Details of the CSG-DR LD have been disclosed in, for instance, the U.S. Pat. No. 7,894,693.

FIG. 8A schematically shows a cross section of a CSG-DR LD 2 according to an embodiment of the present invention, The CSG-DR LD 2 comprises an SG-DFB section 10, a CSG-DR section 20, and two SOA sections, 30 and 40, sandwiching the SG-DFB section 10 and the CSG-DBR section 20 along the optical, or the longitudinal axis of the CSG-DR LD 2. These sections, 10 to 40, are formed on a common semiconductor substrate 50 which has a back electrode 50a in a back surface thereof. Specifically, the SG-DFB section 10 includes, on the semiconductor substrate 50, a lower cladding layer 11, an active layer 12, an upper cladding layer 13, and a cap layer 14. The SG-DFB section 10 may further include discretely distributed optical gratings 15, which is called as the sampled grating, in the lower cladding layer 11. That is, the SG-DFB section 10 comprises a plurality of segments each including a grating region 15a having the diffraction grating and a space region 15b having no diffraction grating. One grating region 15a and one space region 15b constitute one segment. The grating regions 15a each have a periodical structure in the refractive indices, that is, semiconductor materials each having refractive index different from that of the lower cladding layer 11 are surrounded by the lower cladding layer 11, which is called as the sampled grating.

Some of the SG-DFB sections in the examples described below provides two types of regions therein, that is, the gain region 10A and the phase shift region, 10B or 10C. The gain region 10A and the phase shift regions, 10B or 10C, are made of semiconductor materials different from each other. That is, the gain region 10A, as described below, generates photons with a wavelength corresponding to bandgap energy of the active layer 12 in the gain region 10A. On the other hand, the phase shift region, 10B or 10C, modifies the phase of the photons generated in the gain region, which means that the active layer 12 in the phase shift region, 10B or 10C, may be made of semiconductor material with bandgap energy greater than that of the active layer 12 in the gain region. Thus, a layer, 12b or 12c, in the phase shift region, 10B or 10C, next to the active layer 12 becomes transparent for photons generated in the gain region 10A. The gain region 10A has an electrode on the cap layer 14 to inject carriers in the gain region 10A. The carriers injected in the gain region 10A generate photons. While, the phase shift region 10B in FIG. 8B has a heater 17 on the upper cladding layer 13 as interposing an insulating film 16 therebetween. The heater 17 in the phase shift region 10B may modify a temperature of the phase shift region, which also modifies the refractive index of the layers, 11 to 13, thereunder and also an optical length of the phase shift region 10B, which means that the optical cavity in the optical length thereof formed by the SG-DFB section 10 and the CSG-DBR section 20 is modified. Accordingly, the emission wavelength of the CSG-DR LD 2 may be tuned. The phase shift region 10C, instead of the heater 17 in FIG. 8B, may provide an electrode to inject carriers into the active layer 12c in the phase shift region 10C. The carrier density in a semiconductor material may modify the refractive index thereof. Thus, the carrier injection into the layer 12c in the phase shift region 10C may also modify the optical length of the layer 12c, and the cavity length of the CSG-DR LD 2.

The CSG-DBR section 20 also provides the lower cladding layer 11 common to the lower cladding layer 11 in the SG-DFB section 10. The lower cladding layer 11 in the CSG-DBR section 20 also provides discretely disposed grating regions 15a each having periodic structure in the refractive index along the optical axis of the CSG-DR LD 2. Provided on the lower cladding layer 11 is a waveguide layer 22 made of semiconductor material transparent to photons generated in the gain regions of the SG-DFB section 10. The CSG-DBR section 20 also provides the upper cladding layer 13 common to the upper cladding layer 13 in the SG-DFB section 10. Two cladding layers, 11 and 13, sandwiching the waveguide layer 22 in the CSG-DBR section 20 effectively confine light, or photons, generated in the SG-DFB section 10. The CSG-DBR section 20 provides heaters, 27a to 27c, on the top thereof as interposing an insulating film 16, which is common to the insulating film 16 when the SG-DFB section 10 provides the heater 17. The heaters, 27a to 27c, in the CSG-DR section 20 also modify the refractive index of the semiconductor materials therebeneath and vary the optical length thereof. Temperatures of the semiconductor materials, in particular, those forming the waveguide layer 22 beneath the heaters, 27a to 27c, may be independently varied, which means that the equivalent optical length of the waveguide layer 22 may be widely varied. Moreover, one of features of the CSG-DBR section 20 of the present embodiment is that the CSG-DBR section 20 provides several types grating regions 15a and the space regions 15b. That is some of the space regions 15b have a physical length different form physical lengths of the other space regions 15b, and the heaters, 27a to 27c, correspond to those space regions 15b. In the example shown in FIG. 8A, the space region 15b disposed closes to the SG-DFB section 10 has a physical length greater than that of others. This arrangement may widen the wavelength range within which the CSG-DR LD 2 may be tuned.

The SOA sections, 30 and 40, have the same arrangement That is, the SOA sections, 30 and 40, provide the lower cladding layer 11 common to the lower cladding layer 11 in the SG-DFB section 10, the upper cladding layer 13 also common to that in the SG-DFB section 10, the cap layers, 34 and 44, which are isolated from the cap layer 14 of the SG-DFB section 10 but the material and the thickness thereof are same to those of the cap layer 14, and the electrodes, 38 and 48. The SOA sections, 30 and 40, have amplifying layers, 32 and 42, that amplify light generated by the SG-DFB section 10 and determined in the wavelength thereof by the combination of the SG-DFB section 10 and the CSG-DBR section 20. Injecting carriers from the electrodes, 38 and 48, into the amplifying layers, 32 and 42, the SOA sections, 30 and 40, may show the function of the light amplification. The SOA sections, 30 and 40, provide in the outer facets thereof anti-reflection films, 30A and 40A, in order not to cause another optical cavity between the faces.

Both of the SG-DFB section 10 and the CSG-DBR section 20 provide the sampled grating 15 where the grating regions 15a each including diffraction gratings are discretely formed in the lower cladding layer 11 under the active layer 12 in the SG-DFB section 10 and the waveguide layer 22 in the CSG-DBR section 20. Because the SG-DFB section 10 is injected with carriers from the electrode 18 formed in contact with the upper cladding layer 13 or the cap layer 14, the SG-DFB section 10 inherently shows an optical gain spectrum with a plurality of gain peaks attributed to the discretely disposed grating regions 15a, and the wavelength span between the neighbor gain peaks is substantially constant in whole wavelengths subject to the CSG-DR LD 2. On the other hand, the CSG-DBR section 20 provides heaters, 27a to 27c, on the top surface thereof interposing with an insulating film 16 with respect to the upper cladding layer 13. The CSG-DBR section 20 is not injected with carriers but temperatures beneath respective heaters are locally modulated by the heaters, 27a to 27c.

Accordingly, the CSG-DBR section 20 inherently shows reflectance spectrum accompanied with a plurality of reflection peaks. The wavelength span between the neighbor reflection peaks is constant in whole wavelength, but, is different from the wavelength span of the gain peaks attributed to the SG-DFB section 10. In addition, the heaters, 27a to 27c, in the CSG-DBR section 20 may vary temperatures of the waveguide thereunder, which varies optical characteristic of the waveguide, in particular, the refractive index and/or the energy bandgap of materials constituting the waveguide and that of the grating regions 15a and the space regions 15b, the wavelength span of the reflection peaks may be varied. Then, the CSG-DR LD 2 may emit light with a wavelength at which one of the gain peaks attributed to the SG-DFB section 10 coincides with one of the reflection peaks attributed to the CSG-DBR section 20.

The CSG-DBR section 20 of the present embodiment provides three heaters, 27a to 27c, each controlled by the heater driver 63 independently such that the CSG-DR LD 2 emits light at the target wavelength. The heater driver 63 is provided from the controller 69 with information of the target wavelength and the power supplied to respective heaters, 27a to 27c, in order to set the emission wavelength of the CSG-DR LD 2 at the target wavelength. Based on the information thus provided, the heater driver 63 drives respective heaters, 27a to 27e, in the constant power mode. Because the CSG-DR LD 2 implements or integrates no temperature sensors, the temperatures of the waveguide layer 22 in the CSG-DBR section 20 are unable to sense at all. Accordingly, the heater driver 63 controls the heaters, 27a to 27c, in the constant power mode, namely, in the feedforward mode by supplying power between electrodes, 28a and 28g; 28b and 28g; and 28c and 28g, where the electrode 28g may be the ground electrode.

Thus, the emission wavelength of the CSG-DR LD 2 may be determined in a condition where one of the gain peaks coincides attributed to the SG-DFB section 10 with one of the refection peaks attributed to the CSG-DBR section 20. However, the emission wavelength thus determined is not always the target wavelength. Then, a Peltier device 60, which is a type of the thermos-electric cooler (TEC), may adjust the emission wavelength in the target wavelength by varying a temperature of the whole of the CSG-DR LD 2. As mentioned above, optical properties of semiconductor materials depend on a temperature thereof. Accordingly, by commonly adjusting the temperature of the SG-DFB section 10 and that of the CSG-DBR section 20, the emission wavelength may be set in the target wavelength as maintaining the combination of one of the gain peaks and one of the reflection peaks.

The wavelength of light currently emitted from the CSG-DR LD 2 may be detected by two photodiodes (PDs), 68a and 68b, and an etalon filter 67 put in the rear thereof. The light output from the rear facet of the CSG-DR LD 2 is split by the beam splitter (BS) 66b placed in front of the rear facet. One of the split light is detected by the first PD 68a, while, the rest of the split light is detected by the second PD 68b through the etalon filter 67. As described below, the rear SOA 40 is driven by the SOA driver 61b in the constant power mode, that is, the SOA driver 61b drives the rear SOA 40 such that the split light detected by the first PD 68a is kept constant in the power thereof.

On the other hand, the etalon filter 67 inherently shows transmittance strongly depending on the wavelength of the light transmitting thererthrough. That is, the etalon filter 67 has the periodic transmittance. Thus, a ratio of the output of the second PD 68b to the first PD 68a corresponds to the transmittance of the etalon filter 67. Accordingly, the detection by the second PD 68b of the split light equivalently becomes the detection of the wavelength of the light currently emitted from the CSG-DR LD 2. Exactly, because of the periodic transmittance of the etalon filter 67, the detection by the second PD 68b gives a specific wavelength, which is currently emitted, within a half period of the periodic transmittance. Accordingly, when the output of the second PD 68b electrically detected and this output fluctuates in the power thereof, the power fluctuation may be ascribed not only to the fluctuation of the optical output power from the CSG-DR LD 2 but to the fluctuation in the wavelength thereof. Frequency components of the fluctuation may distinguish two modes, namely, the power fluctuation and the wavelength fluctuation. Moreover, the wavelength fluctuation generally shows higher frequency components compared with the power fluctuation. The wavelength fluctuation is directly reflected to the linewidth in the output spectrum of the CSG-DR LD 2. The present invention relates to a technique to narrow the linewidth of the output spectrum of the CSG-DR LD 2.

The wavelength span of the gain peaks attributed to the SG-DFB section 10 may be also modified by the carrier density of the active layer 12. As described in detail, the present optical transmitter 1 utilizes these characteristics inherently attributed to the SG-DFB section 10 in order to narrow linewidth of the emission spectrum of the CSG-DR LD 2.

The CSG-DR LD 2 of the present embodiment, in addition to the SG-DFB section 10 and the CSG-DBR section 20, semiconductor optical amplifiers (SOAs), 30 and 40, neighbor to respective facets of the SG-DFB section 10 and the CSG-DBR section 20. The SOAs, 30 and 40 amplify the laser emission generated by the combination of the SG-DFB section 10 and the CSG-DBR section 20. That is, in the CSG-DR LD 2 of the present embodiment, two SOAs, 30 and 40, sandwiches the SG-DFB section 10 and the CSG-DBR section 20 which are essential to tune the emission wavelength therebetween along the longitudinal axis, namely, the optical axis of the CSG-DR LD 2.

One of the SOAs 30 put between the SG-DFB section 10 and the front facet is driven in the constant power mode by the SOA driver 61a. That is, the SOA driver 61a supplies a bias to the SOA 30 based on an output of the third PD 68c that receives a portion of the light output from the SOA 30 through the anti-reflection (AR) film 30A formed in the front facet of the CSG-DR LD 2. The SOA driver 61a controls the bias provided to the SOA 30 such that the output of the third PD 68c, namely, the portion of the light, is kept in constant in optical power thereof.

The other SOA 40 provided between the rear facet and the CSG-DBR section 30 also operates in the constant power mode by the other SOA driver 61b. That is, the light output from the rear facet is split by the BS 66b set in front of the rear facet of the CSG-DR LD 2, and the first PD 68a senses this portion of the light. The SOA driver 61b provides a bias to the SOA 40 such that the magnitude of the portion of the light output from the rear facet, namely, the output of the PD 68a, is kept in constant in the optical power thereof. The rear facet of the CSG-DR LD 2 of the present embodiment also provides an AR film 30B.

A feature of the optical transmitter 1 of the present embodiment shown in FIG. 1 is that the output of the second PD 68b is fed back to the bias current injected into the SG-DFB section 10. Mechanisms and algorithms to narrow the linewidth of the emission spectrum according to the present embodiment will be described below.

Figure 3:
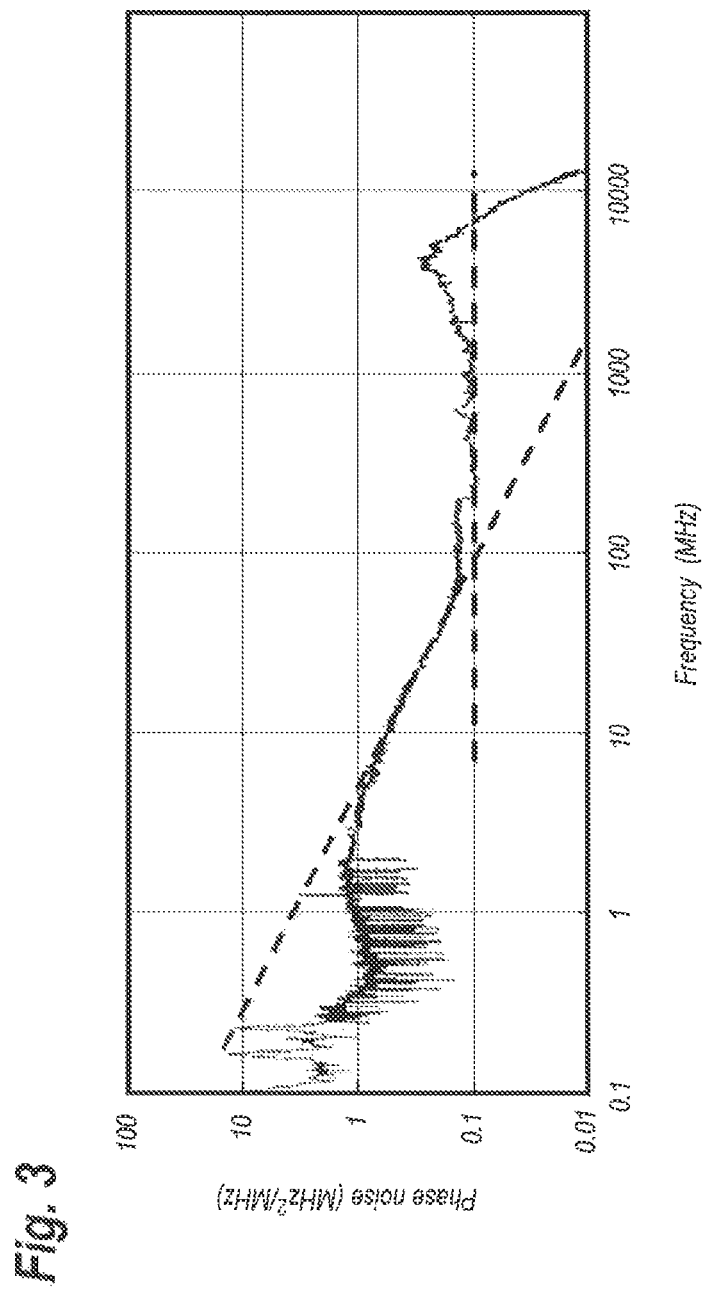
FIG. 3 shows a phase noise spectrum of a chirped sampled grating distributed reflector (CSG-DR) laser diode (LD) of the present embodiment.

FIG. 3 shows a phase noise spectrum of a CSG-DR LD of the present embodiment. The phase noise is directly correlated to the linewidth of the laser emission, that is, the linewidth of the laser emission becomes narrower as the phase noise thereof decreases. As shown in FIG. 3, the white noise becomes dominant for frequencies over 100 MHz, but the flicker noise, which is sometimes called as the 1/f noise, becomes dominant in frequencies less than 100 MHz. Because a CSG-DR LD shows the linewidth of around 300 kHz only by the primitive combination of the SG-DFB section 10 and the CSG-DBR section 20, a reduction of the phase noise with frequencies of 1 to 100 MHz is particularly necessary in order to further narrow the linewidth of the emission spectrum. In order to reduce the 1/f noise of 1 to 100 MHz, the optical transmitter of the present embodiment feeds the output of the second PD 65b to the bias current injected into the SG-DFB section 10.

Figure 4:
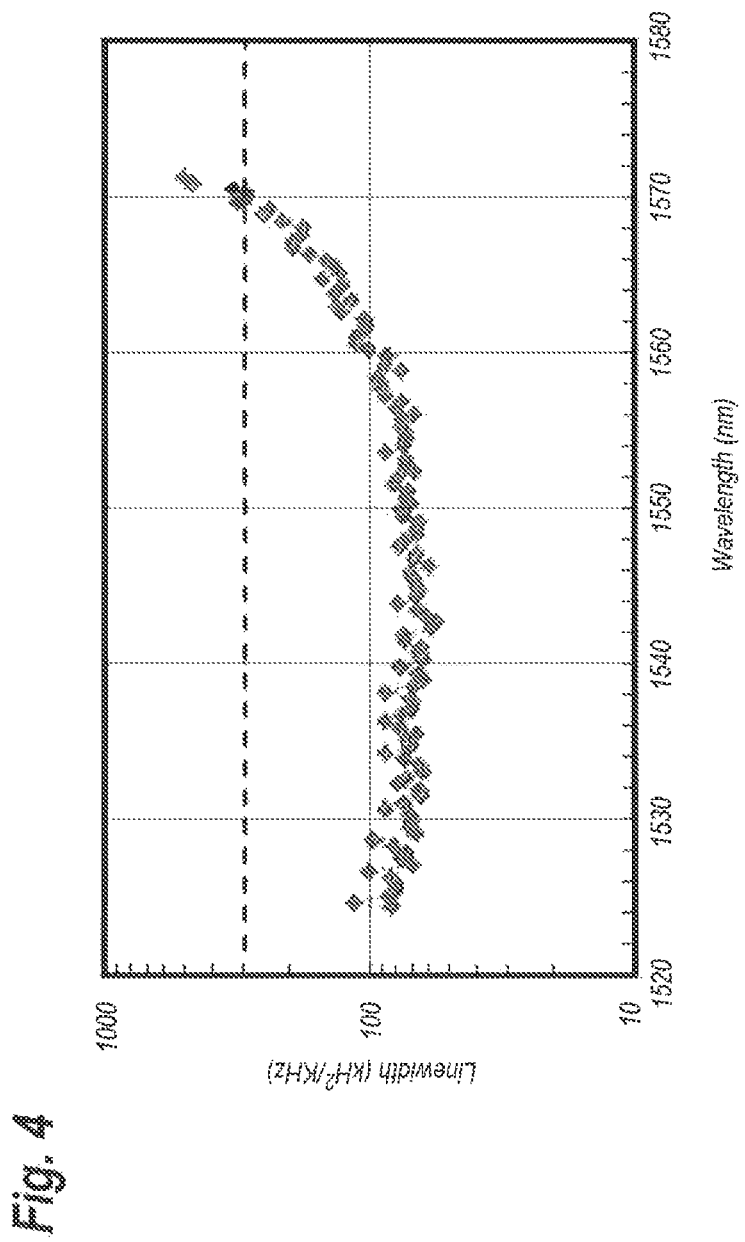
FIG. 4 shows a typical wavelength dependence of the effective linewidth of the emission spectrum of a CSG-DR LD obtained from the spectrum of the phase noise against the wavelength.

Also, the phase noise of an LD, namely, the linewidth in the emission spectrum, generally depends on the wavelength. FIG. 4 shows an example of the wavelength dependence of the effective minimum linewidth of the emission spectrum of an LD obtained from the spectrum of the phase noise against the frequency. An LD applied to the dense wavelength division multiplexing (DWDM) with a frequency span of 50 GHz, the LD is necessary to operate or emit light in a wide range of the wavelength from around 1524 nm (~197 THz) to around 1570 nm (192 THz). As shown in FIG. 4, the linewidth of the laser emission shows dependence on the wavelength. Accordingly, when the reduction of the phase noise is carried out by the feedback loop from the second PD 68b to the bias current, the wavelength dependence of the phase noise should be taken into account. That is, the loop is necessary to adjust the feedback amount depending on the emission wavelength.

Figure 5:
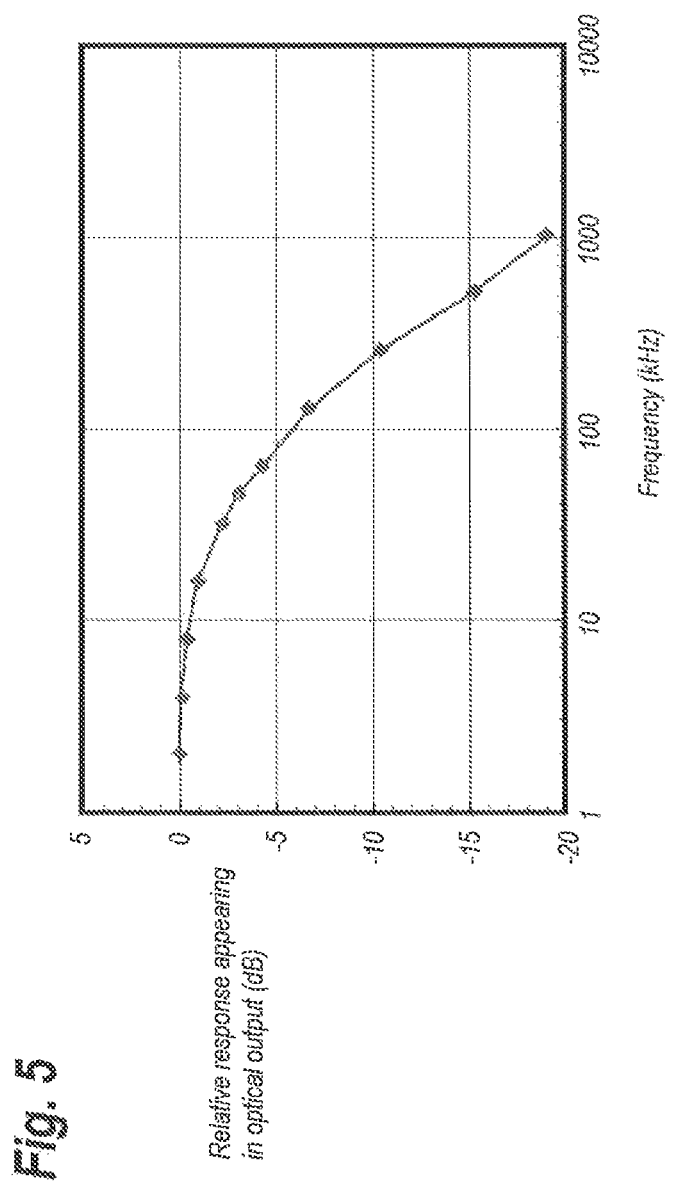
FIG. 5 shows a response appearing in an optical output of the etalon filter when the heater driver superposes an AC signal on the power supplied to the heaters.

An LD of the type of the CSG-DR LID of the present embodiment provides another element to reduce the phase noise appearing in the emission spectrum, that is, the heaters provided in the CSG-DBR section 20 has possibility to reduce the phase noise by the feedback loop. FIG. 5 shows a response appearing in an output of the etalon filter 67 when the heater driver 63 superposes an AC component on the power supplied to the heaters, 27a to 27c, and the second PD 68b detects the AC components contained in the light output from the rear facet and transmitting through the etalon filter 67. FIG. 5 normalizes the response with respect to that of low frequencies.

Because the procedures to reduce the phase noise by the supplement of the power superposed with the AC signal interpose a thermal process, the cut-off frequency of the response inevitably becomes around several scores of kilo-hertz. This frequency is relatively higher as for the thermal process because the heat capacity for respective heaters, 27a to 27c, is quite small in the CSG-DR LD 2 of the present embodiment. However, the response of the heaters, 27a to 27c, is quite slow for compensating the phase noise in a range from 1 to several hundreds of mega-hertz (MHz). Accordingly, a method to modify the power supplied to the heaters, 27a to 27c, seems useless for the reduction of the phase noise.

The etalon filter 67 inherently has the periodic transmittance. Accordingly, a plurality of points in the wavelength gives the specific transmittance same to each other. In another words, the specific wavelength at which the CSG-DR LD 2 may emit is unable to be automatically determined only by the transmittance. One period of the transmittance is generally called as the free spectral range (FSR) within which two equivalent wavelengths showing the transmittance same to each other exits.

Figure 6A:
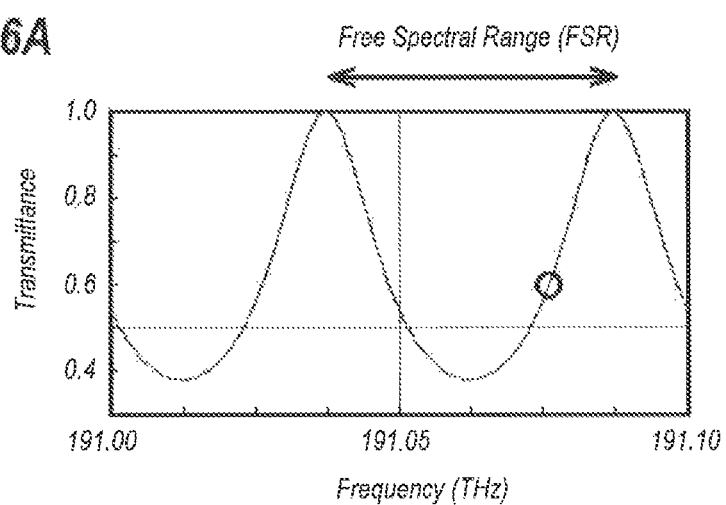
FIGS. 6A and 6B show the transmittance of the etalon filter and describe the free spectral range (FSR) that determines the emission wavelength of the CSG-DR LD.
Figure 6B:
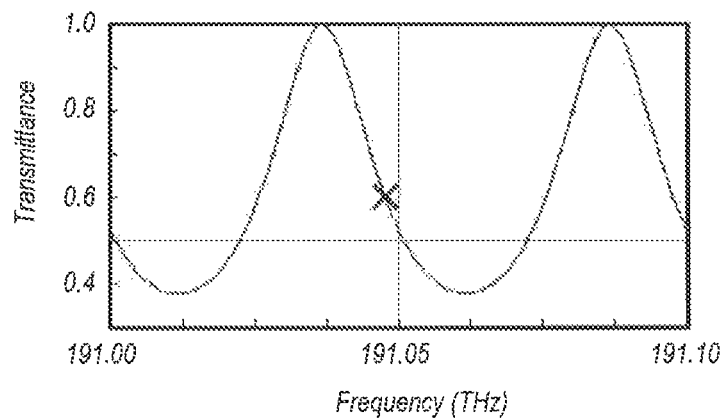

FIGS. 6A and 6B show the transmittance of the etalon filter 67 and explain the FSR to determine the emission wavelength of the CSG-DR LD 2. As described, the etalon filter 67 shows the periodic transmittance with the period of 50 GHz from the transmission peak to the next transmission peak, which corresponds to the FSR, and two wavelengths are determined to show the transmittance of 0.6, one of which locates in the positive slope (FIG. 6A) and the other is in the negative slope (FIG. 6B). Accordingly, the light detected by the second PD 68b changes the phase thereof whether the system sets the wavelength in the point shown in FIG. 6A or in the point shown in FIG. 6B.

Second Embodiment

Figure 2:
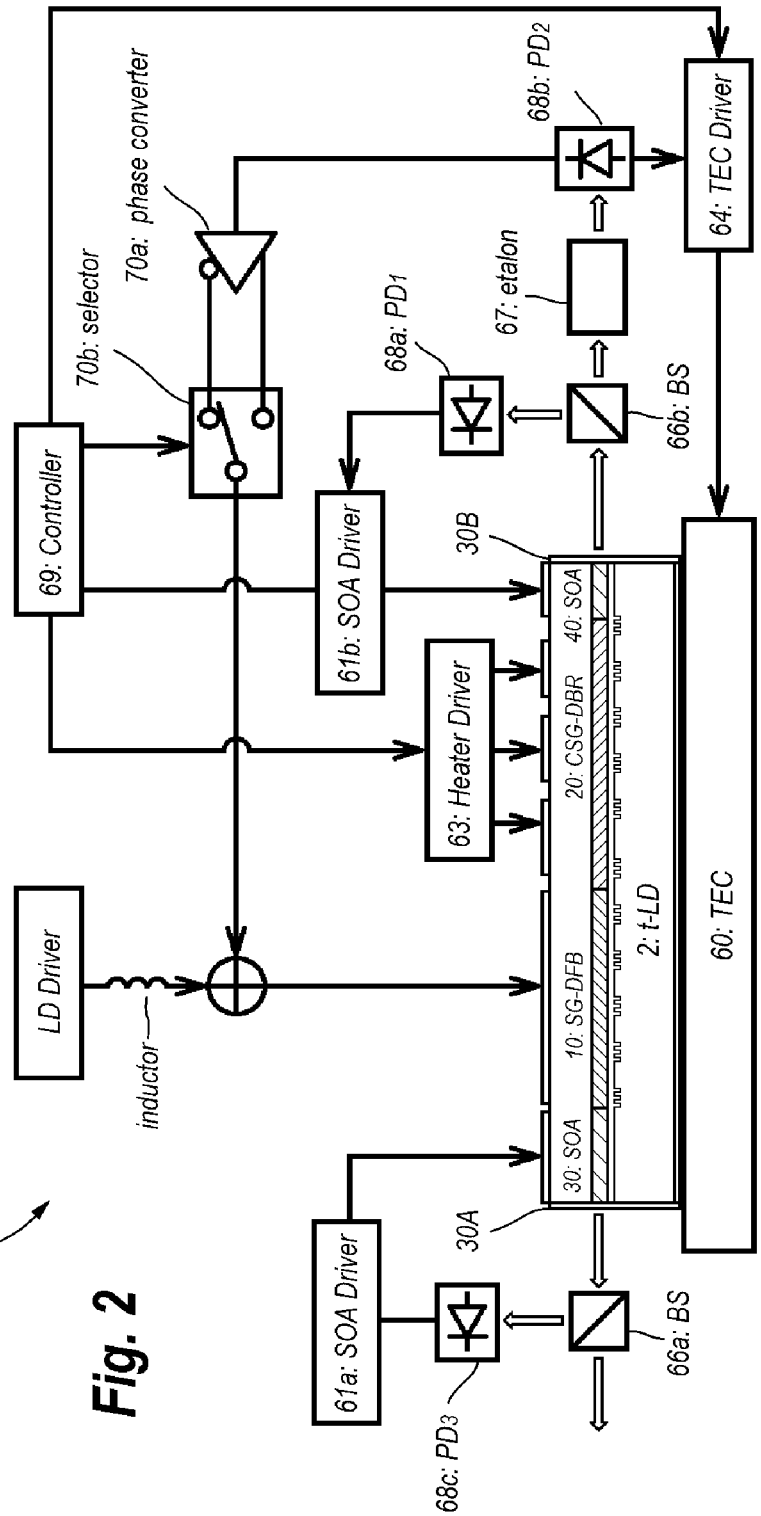
FIG. 2 is a block diagram of the optical transmitter according to the second embodiment of the present invention

FIG. 2 is a block diagram of the optical transmitter 1A according to the second embodiment of the present invention, which makes indifferent as to whether the wavelength of the light currently emitted is in the positive slope or in the negative slope of the transmittance spectrum. That is, the feedback path from the second PD 68b to the SG-DFB section 10 provides a phase converter 70a and a selector 70b. The phase converter 70a, by receiving a mono-phase signal from the second PD 68b, generates two signals complementary to each other. The selector 70b choses one of two signals thus generated by the phase converter 70a by a command provided from the controller 69. Thus, the optical transmitter 1B of the second embodiment may set the wavelength independent of the slope in the transmittance of the etalon filter 67. Or, the optical transmitter 1B may implement an etalon filter 67 whose FSR is 100 GHz and output light whose wavelength conforms to the 50 GHz grid.

Third Embodiment

Figure 7:
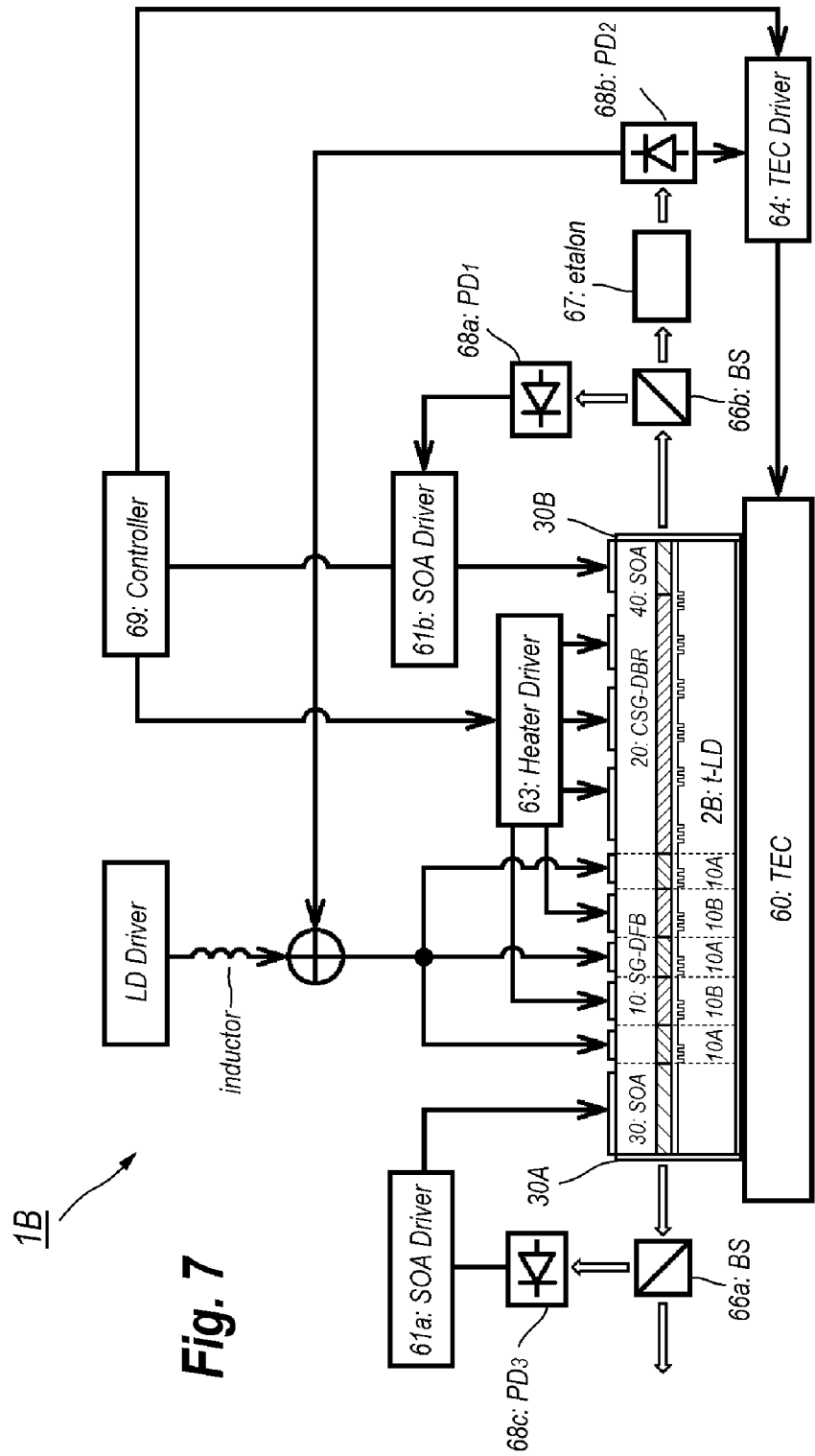
FIG. 7 shows a block diagram of an optical transmitter according to the third embodiment of the invention.

FIG. 7 shows a block diagram of an optical transmitter 1B according to the third embodiment of the invention. Details of the SG-DFB section 10 of the present embodiment are illustrated in FIG. 8B. The optical transmitter 1B shown in FIG. 7 has a feature distinguishable from those of the aforementioned embodiment that the optical transmitter 1B of the third embodiment implements another type of a TDA-CSG-DR LD 2B. The CSG-DR LD 2 of the aforementioned embodiment provides the electrode 18 in the SG-DFB section 10 only to inject current into the active layer 12. On the other hand, the SG-DFB section 10 of the present embodiment provides, in addition to the electrode 18, heaters 17 to vary temperatures of the regions thereneath, and modify the refractive index thereof, which resultantly reflects in the gain spectrum of the SG-DFB section 10. Specifically, by operating the heaters 17 in the SG-DFB section 10 by the constant power mode between the electrodes, 17b and 17g, the span of the gain peaks and the wavelengths thereof are varied. Thus, the SG-DFB section 10 is divided into several regions, parts of which are beneath electrodes 18a to inject the bias currents and rest parts of which are beneath of the heaters 17. The former regions 10A, which are called as the gain region, have active layers 12 having materials same with that in the aforementioned embodiment, and the latter regions 10B, which are called as the phase shift region, have waveguide layers 22 having materials same with the waveguide layer 22 in the CSG-DBR section 20. The combination of the SG-DFB section 10 and the CSG-DBR section 20, similar to the aforementioned embodiment, may determine a unique wavelength at which one of gain peaks attributed to the SG-DFB section 10 coincides with one of reflection peaks attributed to the CSG-DBR section 20.

Also, the TDA-CSG-DR LD 2B shown in FIG. 7 may set the emission wavelength thereof on the target wavelength by adjusting the power supplied not only to the heaters, 27a to 27c, in the CSG-DBR section 20 but to the heaters 17 in the SG-DFB section 10. Because the CSG-DR LD 2 only provides the electrode 18 in the SG-DFB section 10, which may vary the refractive index there but the variation thereof is considerably restricted to those cancelling the phase noise. The TEC 60 finally sets the emission wavelength of the CSG-DR LD 2 on the target wavelength. Accordingly, feeding the output of the second PD 68b only back to the bias current injected into the SG-DFB section 10 negatively, the phase noise contained in the light emitted from the TDA-CSG-DR LD 2B of the present embodiment may be effectively reduced.

Fourth Embodiment

FIG. 8C magnifies the SG-DFB section 10 of the CSG-DR LD 2C according to the fourth embodiment of the present. The SG-DFB section 10 of the embodiment provides the gain region 10A that includes the electrode 18a on the top thereof 12 to inject the bias current to the active layer. The SG-DFB section 10 further provides, substituted from the phase shift regions 10B of the third embodiment, another phase shift regions 10C that provide the electrodes 18c on the top thereof. The phase shift regions 10C have the waveguide layers 12c substantially same with the waveguide layer 22 in the CSG-DBR section 20, where the waveguide layers 12c are transparent for the light subject to the CSG-DR LD 2C.

A semiconductor material, as described above, the optical properties thereof, in particular, the energy bandgap and the refractive index thereof, depend on the temperature. However, semiconductor materials also vary the optical properties thereof depending on carriers, or the carrier density thereof. The electrodes 18a in the gain regions 10A are for injecting carriers into the active layer 12. On the other hand, the other electrodes 18c are provided also for injecting carriers but into the phase shift regions IOC. The feedback from the second PD 68b to the SG-DFB section 10 may be carried out not only to the electrodes 18a of the gain regions 10A but also to the electrodes 18c of the phase shift regions 10C. Because the physical process within a semiconductor material from the carrier injection to the modification of the optical properties is far shorter than that of the thermal process from the supplement of the electrical power to the heater to the modification of the optical properties, the feedback from the output of the second PD 68b to the carrier injection to the phase shift region 10C may also effectively narrow the linewidth of the emission of the CSG-DR LD 2C.

Fifth Embodiment

The subject of the present invention, as described above, is that the noise signal contained in the light output from the CSG-DR LD 2 through the rear SOA 40 is detected and fed back to the injection current negatively to the active layer 12 of the SG-DFB section 10. However, various factors may shift the phase between the injection current and the output light. For instance, the elementary process from the injection of an electron to the generation of a photon, the process from the seeding of one photon to the generation of the coherent light by propagating forward and backward between the SG-DFB section 10 and the CSG-DBR section 20, the elementary process from the reception of the photon to the conversion into an electron in the second FD 68b, and so on, may cause the phase shift. Accordingly, the feedback of the output of the second PD 68b reversely to the injection current does not always become the negative feedback.

Figure 9:
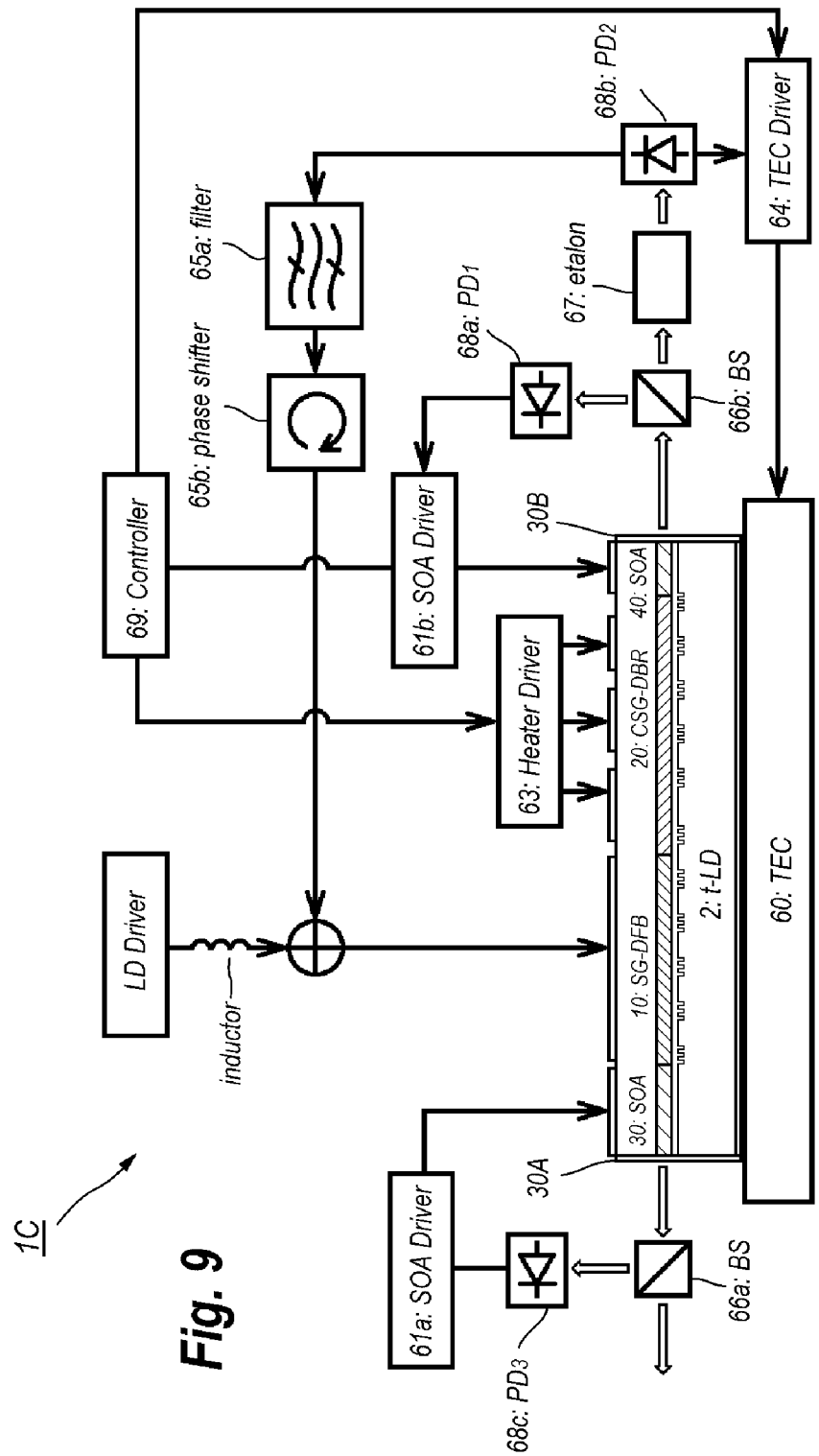
FIG. 9 shows a block diagram of an optical transmitter according to the fourth embodiment of the invention.

An optical transmitter le shown in FIG. 9, accordingly, provides a phase shifter 65b in the feedback path from the second PD 68b to the current injection to adjust the phase of the feedback signal. The optical transmitter shown in FIG. 9 also provides a filter 65a that passes frequency components from 1 to 300 MHz, which corresponds to the frequencies of the phase noise to be reduced. Thus, the feedback compensation of the optical transmitter 1C shown in FIG. 9 may be further stabilized. The optical transmitter 1C shown in FIG. 9 implements the CSG-DR LD 2 of the type of the first embodiment. However, the optical transmitter 1C may implement other types of the CSG-DR LDs, 2B and 2C.

While particular embodiments of the present invention have been described herein for purposes of illustration, many modifications and changes will become apparent to those skilled in the art. Accordingly, the appended claims are intended to encompass all such modifications and changes as fail within the true spirit and scope of this invention.

What is claimed is:

1. An optical transmitter, comprising:
   a wavelength tunable laser diode (t-LD) that emits light at a target wavelength, the t-LD providing a sampled grating distributed feedback (SG-DFB) section and a chirped sampled grating distributed Bragg reflector (CSG-DBR) section that forms an optical cavity combined with the SG-DFB section, the optical cavity setting an emission wavelength of the t-LD at the target wavelength;
   an etalon filter that receives the light emitted from the t-LD and outputs filtered light having an amplitude depending on a wavelength of the light output from the t-LD;
   an optical detector that receives filtered light output from the etalon filter;
   a phase converter that receives the output of the optical detector and outputs two signals complementary to each other; and
   a selector that superposes one of the two complementary signals output from the phase converter on a bias current supplied to the SG-DFB section.

2. The optical transmitter of claim 1,
   wherein the SG-DFB section provides a plurality of gain regions and a plurality of phase shift regions alternately arranged with respect to each other along an optical axis of the optical cavity of the t-LD, and
   wherein the bias current is supplied to the gain regions.

3. The optical transmitter of claim 2, wherein the phase shift regions each have a heater that modifies a temperature of the phase shift regions.

4. The optical transmitter of claim 2, wherein the phase shift regions each have a waveguide layer whose optical properties are modified by a carrier injection thereto.

5. The optical transmitter of claim 1, wherein the CSG-DBR section provides a waveguide layer substantially transparent to the light emitted from the t-LD.

6. The optical transmitter of claim 1 further including a filter and a phase shifter, wherein
   the filter filters the output of the optical detector and outputs a filtered signal, and
   the phase shifter shifts a phase of the filtered signal and superposes a phase-shifted signal on the bias current supplied to the SG-DFB section.

7. The optical transmitter of claim 6, wherein the filter passes the output of the optical detector in frequency components from 1 to 300 MHz.

8. An optical transmitter, comprising:
   a wavelength tunable laser diode (t-LD) that emits light at a target wavelength, the t-LD providing a sampled grating distributed feedback (SG-DFB) section and a chirped sampled grating distributed Bragg reflector (CSG-DBR) section that forms an optical cavity combined with the SG-DFB section, the optical cavity setting an emission wavelength of the t-LD at the target wavelength;
   an etalon filter that receives the light emitted from the t-LD and outputs filtered light with having an amplitude depending on a wavelength of the light; and
   an optical detector that receives the filtered light output from the etalon filter, wherein
   the SG-DFB section provides a plurality of gain regions and a plurality of phase shift regions alternatively arranged with respect to each other along an optical axis of the optical cavity of the t-LD, and the CSG-DBR section provides a waveguide layer substantially transparent to the light emitted from the t-LD, and the output of the optical detector is superposed on a basis current supplied to the gain regions in the SG-DFB section.

9. The optical transmitter of claim 8,
wherein the phase shift regions each have a heater that modifies a temperature of the phase shift regions.

10. The optical transmitter of claim 8,
wherein the phase shift regions each have a waveguide layer whose optical properties are modified by a carrier injection thereto.

11. An optical transmitter, comprising:
A waveguide tunable laser diode t-LD) that emits light at a target wavelength, the t-LD providing a sampled grating distributed feedback (SG-DFB) section and a chirped sampled grating distributed Bragg reflector (CSG-DBR) section that forms an optical cavity combined with the SG-DFB section, the optical cavity setting an emission wavelength of the t-LD at the target wavelength;
an etalon filter that receives the light emitted from the t-LD and outputs filtered light with amplitude depending on a wavelength of the light; and
an optical detector that receives the filtered light and outputs a filtered signal;
a phase shifter that shifts a phase of the filtered signal and outputs a phase-shifted signal,
wherein the phase-shifted signal is superposed on a bias current supplied to the SG-DFB section.

12. The optical transmitter of claim 11,
wherein the filter passes the filtered signal in frequency components from 1 to 300 MHz.

* * * * *